(12) United States Patent
Hayashi

(10) Patent No.: US 11,711,026 B2
(45) Date of Patent: Jul. 25, 2023

(54) POWER SUPPLY DEVICE FOR BOOSTING AN INPUT VOLTAGE

(71) Applicant: Asahi Kasei Microdevices Corporation, Tokyo (JP)

(72) Inventor: Teppei Hayashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 197 days.

(21) Appl. No.: 17/352,402

(22) Filed: Jun. 21, 2021

(65) Prior Publication Data

US 2021/0408932 A1 Dec. 30, 2021

(30) Foreign Application Priority Data

Jun. 26, 2020 (JP) ................................ 2020-110789

(51) Int. Cl.
*H02M 7/217* (2006.01)
*H03B 5/12* (2006.01)
(Continued)

(52) U.S. Cl.
CPC .......... *H02M 7/217* (2013.01); *H03B 5/1228* (2013.01); *H03K 5/24* (2013.01); *H02J 50/001* (2020.01)

(58) Field of Classification Search
CPC ............ H02M 3/22; H02M 1/08; H02M 1/36; H02M 3/24; H02M 3/325; H02M 3/335; H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/1582; H02M 3/1584; H02M 3/285; H02M 3/33561; H02M 7/49; H02M 1/045; H02M 7/006;
(Continued)

(56) References Cited

U.S. PATENT DOCUMENTS

| 4,542,330 A * | 9/1985 | Terbrack ............... H02M 3/156 323/901 |
| 8,330,549 B1 * | 12/2012 | Chen .................... H03B 5/1231 331/117 R |

(Continued)

FOREIGN PATENT DOCUMENTS

| JP | H0197166 A | 4/1989 |
| JP | 2004048880 A | 2/2004 |

*Primary Examiner* — Thienvu V Tran
*Assistant Examiner* — Nusrat Quddus

(57) ABSTRACT

There is provided a power supply device configured to boost an input voltage to output an output voltage, the power supply device including: an oscillator circuit configured to receive the input voltage and to output an oscillation signal; a step-up circuit configured to output a boost voltage based on the oscillation signal; a first hysteresis comparator and a second hysteresis comparator configured to compare boost voltages with threshold values; a first switch that is connected between the oscillator circuit and the step-up circuit and that is controlled based on a comparison result of the first hysteresis comparator; and a second switch that is connected to an output terminal configured to output the output voltage and that is controlled based on a comparison result of the second hysteresis comparator.

21 Claims, 14 Drawing Sheets

(51) Int. Cl.
*H03K 5/24* (2006.01)
*H02J 50/00* (2016.01)

(58) Field of Classification Search
CPC ........ H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/477; H02M 5/456; H02M 1/12; H02M 1/4266; H02M 2001/123; Y02B 70/1491; H02J 3/38; H02J 3/36; H02J 3/01; H02H 7/261; H02H 7/268

See application file for complete search history.

(56) References Cited

U.S. PATENT DOCUMENTS

| | | | |
|---|---|---|---|
| 9,325,250 | B2 | 4/2016 | Salerno |
| 10,516,341 | B1* | 12/2019 | Fu ..................... H02M 3/33592 |
| 10,651,754 | B1* | 5/2020 | Murugesan ....... H02M 3/33523 |
| 10,910,954 | B1* | 2/2021 | Shah ..................... H01R 24/60 |
| 2003/0063479 | A1* | 4/2003 | Morita ............... H02M 1/4258 363/37 |
| 2010/0309696 | A1* | 12/2010 | Guillot ............. H02M 3/33507 363/124 |
| 2011/0018618 | A1 | 1/2011 | Shiu |
| 2013/0182464 | A1* | 7/2013 | Woias ................ H02M 3/3382 363/21.17 |
| 2013/0334884 | A1* | 12/2013 | Arisawa .................. H02M 7/06 307/151 |
| 2014/0192575 | A1* | 7/2014 | Olivik ............... H02M 3/33592 363/89 |
| 2014/0300274 | A1* | 10/2014 | Acatrinei ........... H05B 45/3578 315/122 |
| 2015/0180411 | A1 | 6/2015 | Gao |
| 2018/0145583 | A1* | 5/2018 | Nakano ............. G03G 15/5004 |
| 2019/0265080 | A1 | 8/2019 | Awatsu |

* cited by examiner

POWER SUPPLY DEVICE FOR BOOSTING AN INPUT VOLTAGE

The contents of the following Japanese patent application(s) are incorporated herein by reference:
NO. 2020-110789 filed in JP on Jun. 26, 2020.

BACKGROUND

1. Technical Field

The present invention relates to a power supply device.

2. Related Art

For example, thermoelectric generation which is used in an energy harvesting system and in which power is generated by a temperature difference has an output voltage as low as several tens of mV, and thus for the thermoelectric generation, boosting by a typical step-up circuit is not possible. Patent Document 1 discloses that a low-voltage power source of less than 100 mV is boosted by rectifying an oscillating waveform produced by an oscillator using an N-fold transformer.

Patent Document 1: Specification of U.S. Pat. No. 9,325,250

3. Technical Problem

However, in a circuit as in Patent Document 1, an oscillation operation continues even after an output voltage reaches a desired voltage, and thus energy of an input source is wasted. In energy harvesting, for example, such a circuit leads to wear of a harvesting element, and thus is not suitable for a sustainable system.

SUMMARY

In order to solve the above-described problem, a first aspect of the present invention provides a power supply device configured to boost an input voltage to output an output voltage. The power supply device may include an oscillator circuit configured to receive the input voltage and to output an oscillation signal. The power supply device may include a step-up circuit configured to output a boost voltage based on the oscillation signal. The power supply device may include a first hysteresis comparator and a second hysteresis comparator configured to compare boost voltages with reference voltage such as threshold values, and to output comparison results. The power supply device may include a second switch that is connected to an output terminal configured to output the output voltage and that is controlled based on a comparison result of the second hysteresis comparator.

A first switch may have a first end which is connected to a base voltage terminal, a second end which is connected to a node between the oscillator circuit and the step-up circuit, and a control terminal to which the comparison result is input.

The power supply device may include a rectifier circuit arranged between the oscillator circuit and the step-up circuit, and configured to cause a current from the oscillator circuit to flow to the step-up circuit. The first switch may be connected between the oscillator circuit and the rectifier circuit.

The power supply device may include a first capacitor that has a first end which is connected to the oscillator circuit, and a second end which is connected to a node between the oscillator circuit and the step-up circuit.

The first switch may be connected between the step-up circuit and the first capacitor.

The power supply device may include a second capacitor that has a first end which is connected to a node between the oscillator circuit and the step-up circuit, and a second end which is connected to the first switch.

The first hysteresis comparator may be configured to control the first switch to be turned on in response to a detection that the boost voltage is higher than or equal to a first threshold value, and to control the first switch to be turned off in response to a detection that the boost voltage is lower than or equal to a second threshold value.

The second hysteresis comparator may be configured to control the second switch to be turned on and start the output of the output voltage in response to a detection that the boost voltage is higher than or equal to a third threshold value, and to control the second switch to be turned off and stop the output of the output voltage in response to a detection that the boost voltage is lower than or equal to a fourth threshold value.

The oscillator circuit may include a first coil that has a first end which is connected to an input terminal of the oscillator circuit. The oscillator circuit may include a second coil that has a first end which is connected to an output terminal of the oscillator circuit. The oscillator circuit may include a third switch that is connected between a second end of the first coil and the base voltage terminal and that has a control terminal which is connected to the output terminal of the oscillator circuit. The oscillator circuit may include a first oscillator capacitor that has a first end which is connected to the first end of the first coil, and a second end which is connected to a second end of the second coil.

The oscillator circuit may further include a resistor that has a first end which is connected to a node between the control terminal of the third switch and the output terminal of the oscillator circuit, and a second end which is connected to the base voltage terminal.

The oscillator circuit may include a first coil that has a first end which is connected to an input terminal of the oscillator circuit. The oscillator circuit may include a second coil that has a first end which is connected to an output terminal of the oscillator circuit. The oscillator circuit may include a third switch that is connected between a second end of the first coil and the base voltage terminal and that has a control terminal which is connected to the output terminal of the oscillator circuit. The oscillator circuit may include a resistor that has a first end which is connected to a node between the control terminal of the third switch and the output terminal of the oscillator circuit, and a second end which is connected to the base voltage terminal. The oscillator circuit may include a first oscillator capacitor that has a first end which is connected to the second end of the first coil, and a second end which is connected to a second end of the second coil.

The oscillator circuit may include a first coil that has a first end which is connected to an input terminal of the oscillator circuit. The oscillator circuit may include a second coil that has a first end which is connected to an output terminal of the oscillator circuit, and a second end which is connected to a second end of the first coil. The oscillator circuit may include a third switch that is connected between the second end of the first coil and the base voltage terminal. The oscillator circuit may include a second oscillator capacitor that has a first end which is connected to the output terminal of the oscillator circuit, and a second end which is connected to a control terminal of the third switch. The oscillator circuit may include a resistor that has a first end which is connected to a node between the control terminal of the third switch and the second end of the second oscillator capacitor, and a second end which is connected to the base voltage terminal.

The oscillator circuit may include a first coil that has a first end which is connected to an input terminal of the oscillator circuit. The oscillator circuit may include a second coil that has a first end which is connected to an output terminal of the oscillator circuit, and a second end which is connected to a second end of the first coil. The oscillator circuit may include a third switch that is connected between the second end of the first coil and the base voltage terminal and that has a control terminal which is connected to the output terminal of the oscillator circuit.

The oscillator circuit may include a first coil that has a first end which is connected to an input terminal of the oscillator circuit. The oscillator circuit may include a second coil that has a first end which is connected to an output terminal of the oscillator circuit, and a second end which is connected to the input terminal of the oscillator circuit. The oscillator circuit may include a third switch that is connected between a second end of the first coil and the base voltage terminal and that has a control terminal which is connected to the output terminal of the oscillator circuit.

The input voltage may be a voltage generated by energy harvesting.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

Figure 1:
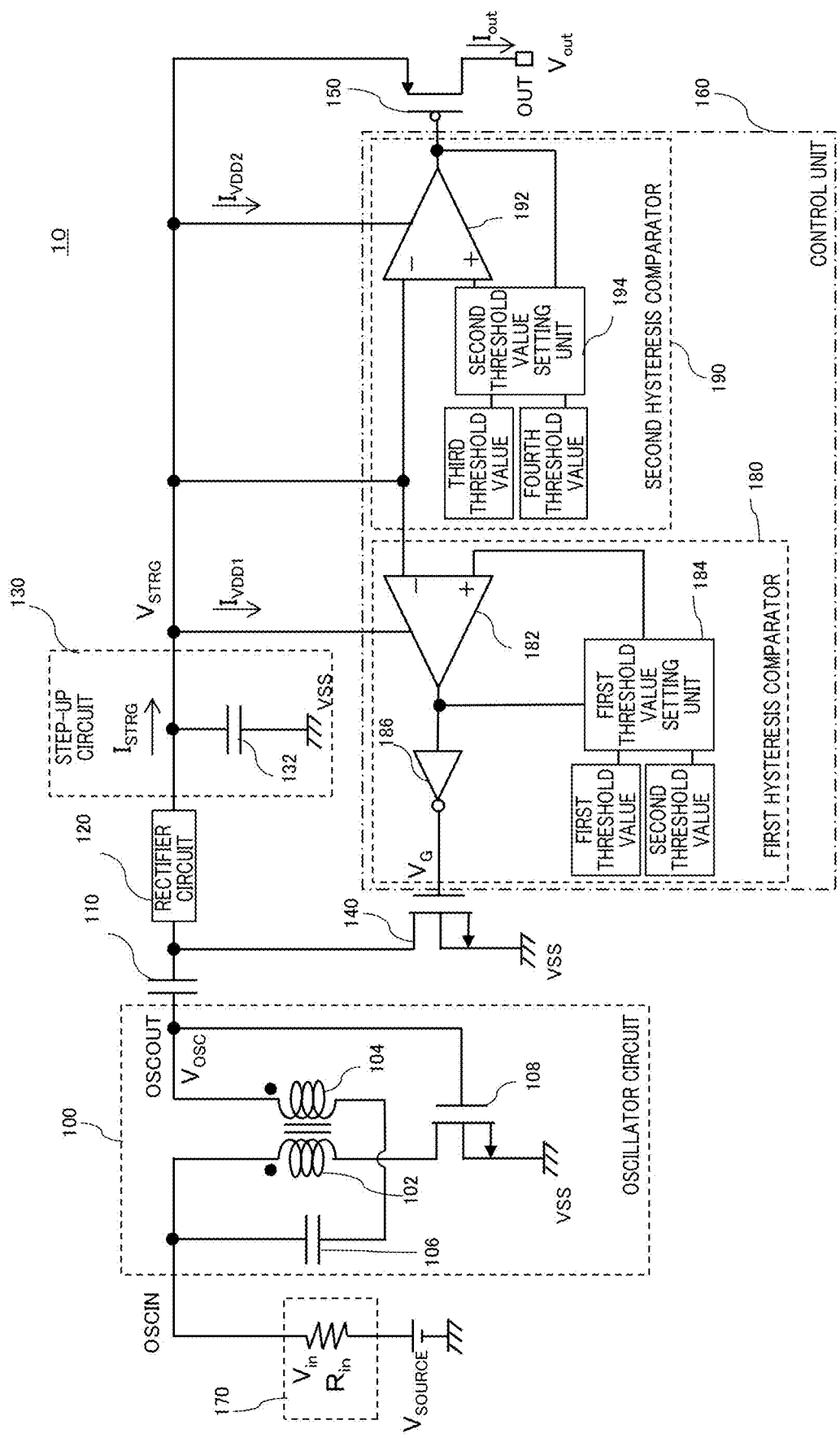
FIG. 1 shows a configuration example of a power supply device 10 of the present embodiment.

FIG. 1 shows a configuration example of a power supply device 10 of the present embodiment. The power supply device 10 may be, for example, a DC to DC converter of a step-up type that outputs an output voltage by boosting an input voltage $V_{in}$ supplied from an external input source for energy harvesting or the like. Here, for example, the energy harvesting is: photovoltaic power generation which uses, as an energy source, light energy from sunlight, an incandescent lamp, a fluorescent lamp, an LED, or the like; thermoelectric generation which uses, as the energy source, heat energy from heat generated by machinery, environment temperature, or the like; vibration power generation which uses, as the energy source, vibration generated by machinery or vibration of a bridge, a road, or the like; electromagnetic wave power generation which uses, as energy, an electromagnetic wave, an electric wave, or the like; organism power generation which is represented by a microbial fuel cell and which converts an amount of activity of a living being into energy; chemical power generation which converts chemical energy from a galvanic cell or the like into electrical energy; or the like.

The power supply device 10 includes an oscillator circuit 100, a first capacitor 110, a rectifier circuit 120, a step-up circuit 130, a first switch 140, a second switch 150, and a control unit 160. The power supply device 10 outputs an oscillation signal in response to a DC input voltage $V_{in}$ in the oscillator circuit 100, boosts the oscillation signal flowing via the rectifier circuit 120 in the step-up circuit 130, and outputs a DC output voltage. The power supply device 10 performs an appropriate boosting operation by the control unit 160 controlling the first switch 140 and the second switch 150 based on a boost voltage. In the power supply device 10, a voltage $V_{source}$ supplied from the external input source is stepped down by an internal resistance $R_{in}$ and a current $I_{in}$ of the power supply device 10, and the input voltage $V_{in}$ is input from an input unit 170.

The oscillator circuit 100 is connected between the input unit 170 and the first capacitor 110 of the power supply device 10. In the oscillator circuit 100, the input voltage $V_{in}$ is input, and the oscillation signal is generated by using the input voltage $V_{in}$ to be output to the step-up circuit 130 via the first capacitor 110. The oscillator circuit 100 may generate the oscillation signal with an amplitude which is m-fold (m>0) of the input voltage $V_{in}$. The oscillator circuit 100 has a first coil 102, a second coil 104, a first oscillator capacitor 106, and a third switch 108.

The first coil 102 has a first end which is connected to an input terminal OSCIN of the oscillator circuit 100, and a second end which is connected to the third switch 108. The second coil 104 has a first end which is connected to an output terminal OSCOUT of the oscillator circuit 100, and a second end which is connected to the first oscillator capacitor 106. A turns ratio of the first coil 102 to the second coil 104 may be 1:N (N>1). The first oscillator capacitor 106 has a first end which is connected to the second coil 104, and a second end which is connected to a node between the first coil 102 and the input unit 170. The third switch 108 has a first end (for example, a drain) which is connected to the first coil 102, a second end (for example, a source) which is connected to a base voltage terminal VSS, and a control terminal (for example, a gate) which is connected to the output terminal OSCOUT of the oscillator circuit 100. The third switch 108 may be an NMOS transistor of a depletion type, or a Native NMOS transistor. In such a configuration, the oscillator circuit 100 may generate and output the oscillation signal with an amplitude obtained by transforming the input voltage $V_{in}$ at a predetermined ratio. Note that the base voltage terminal VSS may be a ground terminal.

The first capacitor 110 has a first end which is connected to the oscillator circuit 100, and a second end which is connected to a node between the oscillator circuit 100 and the step-up circuit 130. The first capacitor 110 may have the first end which is connected to the second coil 104 of the oscillator circuit 100, and the second end which is connected to the step-up circuit 130 via the rectifier circuit 120.

The rectifier circuit 120 may be a diode that is arranged between the oscillator circuit 100 and the step-up circuit 130 and that causes a current from the oscillator circuit 100 to flow to the step-up circuit 130. The rectifier circuit 120 may, for example, convert the oscillation signal from the oscillator circuit 100 into a direct current.

The step-up circuit 130 is connected between the rectifier circuit 120 and an output terminal OUT, and outputs a boost voltage $V_{STRG}$ based on the oscillation signal. The step-up circuit 130 has a step-up capacitor 132 having a first end which is connected to a node between the rectifier circuit 120 and the output terminal OUT, and a second end which is connected to the base voltage terminal VSS. The step-up circuit 130 may output the boost voltage $V_{STRG}$ boosted by the step-up capacitor 132 being charged with the current from the rectifier circuit 120.

The first switch 140 is connected between the oscillator circuit 100 and the step-up circuit 130, and is controlled based on a comparison result of a first hysteresis comparator. The first switch 140 may have a first end (for example, the source) which is connected to the base voltage terminal VSS, a second end (for example, the drain) which is connected to the node between the oscillator circuit 100 and the step-up circuit 130, and a control terminal (for example, the gate) to which an output (a comparison result) of a first hysteresis comparator 180 is input. In the present embodiment, the first switch 140 may be connected between the first capacitor 110 and the step-up circuit 130, and specifically, the second end may be connected to a node between the first capacitor 110 and the rectifier circuit 120. The first switch 140 may be an NMOS transistor.

The second switch 150 is connected to the output terminal OUT that outputs an output voltage $V_{OUT}$, and is controlled based on a comparison result of a second hysteresis comparator. The second switch 150 may have a first end (for example, the source) which is connected to the step-up circuit 130, a second end (for example, the drain) which is connected to the output terminal OUT, and a control terminal (for example, the gate) to which an output of a second hysteresis comparator 190 is input. The second switch 150 may be a PMOS transistor.

The control unit 160 respectively controls the first switch 140 and the second switch 150 based on the boost voltage $V_{STRG}$ such that the output voltage $V_{OUT}$ is within a desired range. The control unit 160 has the first hysteresis comparator 180 and the second hysteresis comparator 190.

The first hysteresis comparator 180 compares the boost voltage $V_{STRG}$ output from the step-up circuit 130 with one of a first threshold value and a second threshold value, and outputs, to the first switch 140, a signal in accordance with the comparison result. The first hysteresis comparator 180 may control the first switch 140 to be turned on in response to a detection that the boost voltage $V_{STRG}$ is higher than or equal to the first threshold value, and control the first switch 140 to be turned off in response to a detection that the boost voltage $V_{STRG}$ is lower than or equal to the second threshold value. The first threshold value may be a value higher than the second threshold value. The first threshold value and the second threshold value may be preset by a user or the like. The first hysteresis comparator 180 has a first comparator 182, a first threshold value setting unit 184, and an inverter 186.

The first comparator 182 has one input which is connected to a node between the step-up circuit 130 and the output terminal OUT, the other input which is connected to the first threshold value setting unit 184, and an output which is connected to the first switch 140 via the inverter 186. The first comparator 182 may compare the input boost voltage $V_{STRG}$ with the first threshold value or the second threshold value, and output a signal in accordance with the comparison result.

The first threshold value setting unit 184 is connected to the output of the first comparator 182, and outputs, to the first comparator 182, any of the first threshold value and the second threshold value according to the output of the first comparator 182. The first threshold value setting unit 184 may include a switch for switching between the first threshold value and the second threshold value.

The second hysteresis comparator 190 compares the boost voltage $V_{STRG}$ output from the step-up circuit 130 with one of a third threshold value and a fourth threshold value, and outputs, to the second switch 150, a signal in accordance with the comparison result. The second hysteresis comparator 190 may control the second switch 150 to be turned on and start the output of the output voltage $V_{OUT}$ in response to a detection that the boost voltage $V_{STRG}$ is higher than or equal to the third threshold value, and the second hysteresis comparator 190 may control the second switch 150 to be turned off and stop the output of the output voltage $V_{OUT}$ in response to a detection that the boost voltage $V_{STRG}$ is lower than or equal to the fourth threshold value. The third threshold value may be a value higher than the fourth threshold value, and the third threshold value and the fourth threshold value may also be values lower than the first threshold value and the second threshold value. The third threshold value and the fourth threshold value may be preset by the user or the like. The second hysteresis comparator 190 has a second comparator 192, and a second threshold value setting unit 194. The second comparator 192 has one input which is connected to a node between the step-up circuit 130 and the output terminal OUT, the other input which is connected to the second threshold value setting unit 194, and an output which is connected to the second switch 150. The second comparator 192 may compare the input boost voltage $V_{STRG}$ with the third threshold value or the fourth threshold value, and output a signal in accordance with the comparison result.

The second threshold value setting unit 194 is connected to the output of the second comparator 192, and outputs, to the second comparator 192, any of the third threshold value and the fourth threshold value according to the output of the second comparator 192. The second threshold value setting unit 194 may include a switch for switching between the third threshold value and the fourth threshold value. Then, a voltage control operation in the power supply device 10 in the present embodiment will be described.

Figure 2:
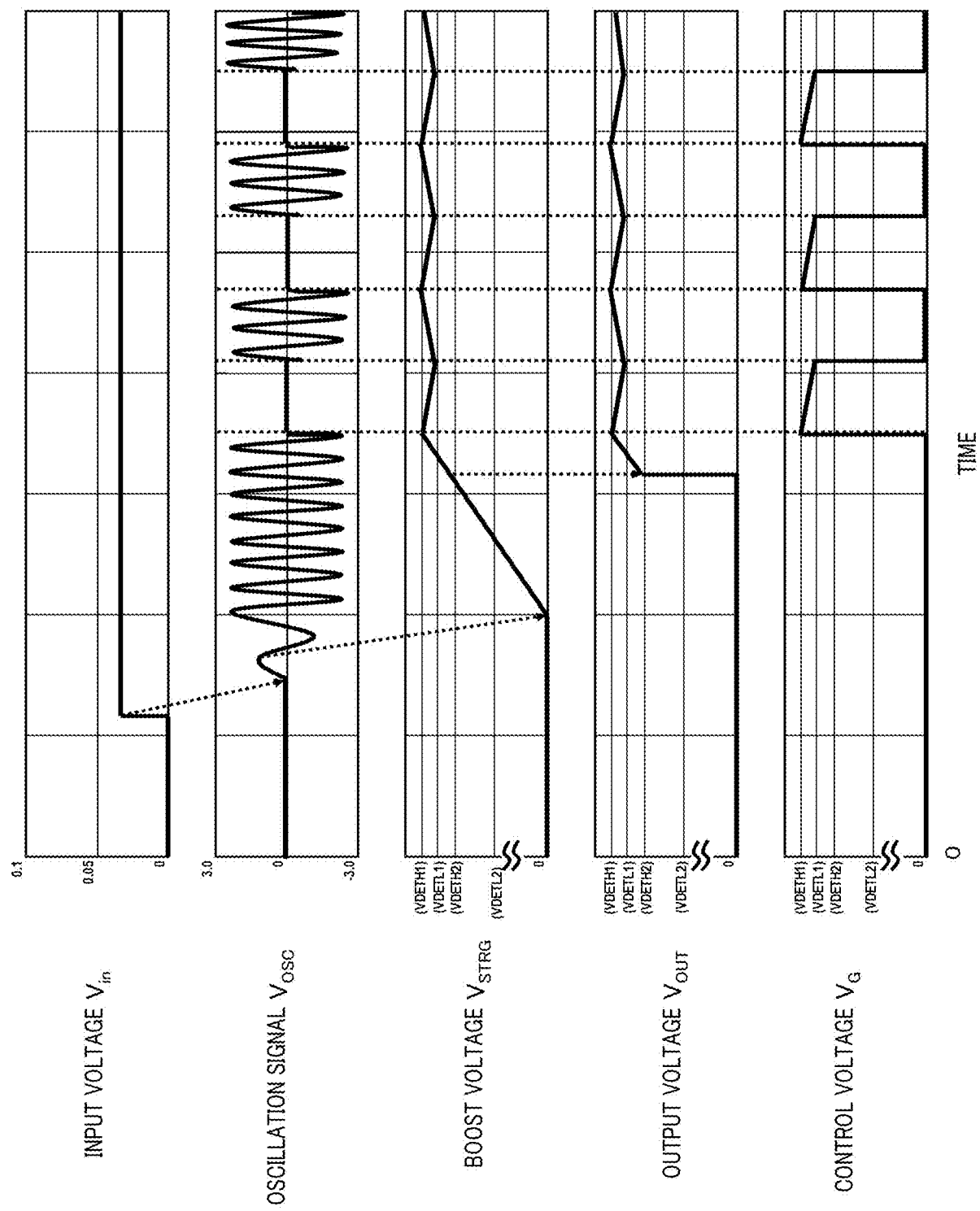
FIG. 2 shows a transition of a voltage at each location of the power supply device 10.

FIG. 2 shows a transition of a voltage at each location of the power supply device 10. In each graph, a vertical axis represents a voltage and a horizontal axis represents a passage of time. An input voltage $V_{in}$ is the input voltage $V_{in}$ which is input to the oscillator circuit 100, an oscillation signal $V_{OSC}$ is the oscillation signal which is output by the oscillator circuit 100, a boost voltage $V_{STRG}$ is the boost voltage which is boosted by the step-up circuit 130, an output voltage $V_{OUT}$ is the output voltage which is output from the output terminal OUT of the power supply device 10, and a control voltage $V_G$ is a control voltage which is input to the control terminal of the first switch 140. FIG. 2 shows the transition of the voltage when a relationship between a current $I_{STRG}$ output from step-up circuit 130, a current $I_{VDD1}$ consumed by the first hysteresis comparator 180, a current $I_{VDD2}$ consumed by the second hysteresis comparator 190, and a current $I_{OUT}$ output from the output terminal OUT is $I_{STRG} > I_{OUT} + I_{VDD1} + I_{VDD2}$.

The oscillator circuit 100 generates and outputs the oscillation signal $V_{OSC}$ when the input voltage $V_{in}$ reaches a predetermined voltage. With an initial electric charge being zero, the step-up capacitor 132 of the step-up circuit 130 starts the boosting operation in response to the oscillation signal $V_{OSC}$, an electric charge is accumulated in the step-up capacitor 132, and the boost voltage $V_{STRG}$ rises. Then, the control unit 160 controls at least one of the first switch 140 and the second switch 150 according to the boost voltage $V_{STRG}$.

The second switch 150 is controlled to be turned on and start the output of the output voltage $V_{OUT}$ in response to the second hysteresis comparator 190 detecting that the boost voltage $V_{STRG}$ is higher than or equal to the third threshold value (VDETH2). Specifically, the second comparator 192 of the second hysteresis comparator 190 compares the boost voltage $V_{STRG}$ with the third threshold value set by the second threshold value setting unit 194, and when the boost voltage $V_{STRG}$ is higher than or equal to the third threshold value, the second comparator 192 applies a voltage to the control terminal of the second switch 150 to turn on the second switch 150.

Subsequently, the boosting operation in the step-up circuit 130 continues, the first switch 140 is controlled to be turned on in response to the first hysteresis comparator 180 detecting that the boost voltage $V_{STRG}$ is higher than or equal to the first threshold value (VDETH1). Specifically, the first comparator 182 of the first hysteresis comparator 180 compares the boost voltage $V_{STRG}$ with the first threshold value set by the first threshold value setting unit 184, and when the boost voltage $V_{STRG}$ is higher than or equal to the first threshold value, the first comparator 182 applies a voltage to the control terminal of the first switch 140 to turn on the first switch 140. By turning on the first switch 140, the rectifier circuit 120 is forced to a base voltage in front of itself, and the first capacitor 110 serves as a load capacitor on a secondary side of the oscillator circuit 100, and thus it is possible to significantly reduce an oscillation frequency or break an oscillation condition, and it is possible to stop an oscillation operation. Further, the node between the first capacitor 110 and the rectifier circuit 120 serves as the base voltage (for example, the ground), the boosting operation stops, and thus an overvoltage of $V_{STRG}$ or $V_{OUT}$ can be prevented.

After the boosting is stopped, the boost voltage $V_{STRG}$ gradually drops due to a leakage current of the step-up capacitor 132 which is a power storage element, current consumption of a system connected to the output terminal, or the like. The first switch 140 is controlled to be turned off in response to the first hysteresis comparator 180 detecting that the boost voltage $V_{STRG}$ is lower than or equal to the second threshold value (VDETL1). Specifically, the first comparator 182 of the first hysteresis comparator 180 compares the boost voltage $V_{STRG}$ with the second threshold value set by the first threshold value setting unit 184, and when the boost voltage $V_{STRG}$ is lower than or equal to the second threshold value, the first comparator 182 outputs a signal to the control terminal of the first switch 140 to turn off the first switch 140. Thereby, a boost stop control by the first switch 140 is released, and the boosting resumes. By such a control, an external system connected to the output terminal of the power supply device 10 of the present embodiment can operate at the output voltage $V_{OUT}$ in a range of the third threshold value (VDETH2) or higher and the first threshold value (VDETH1) or lower.

Figure 3:
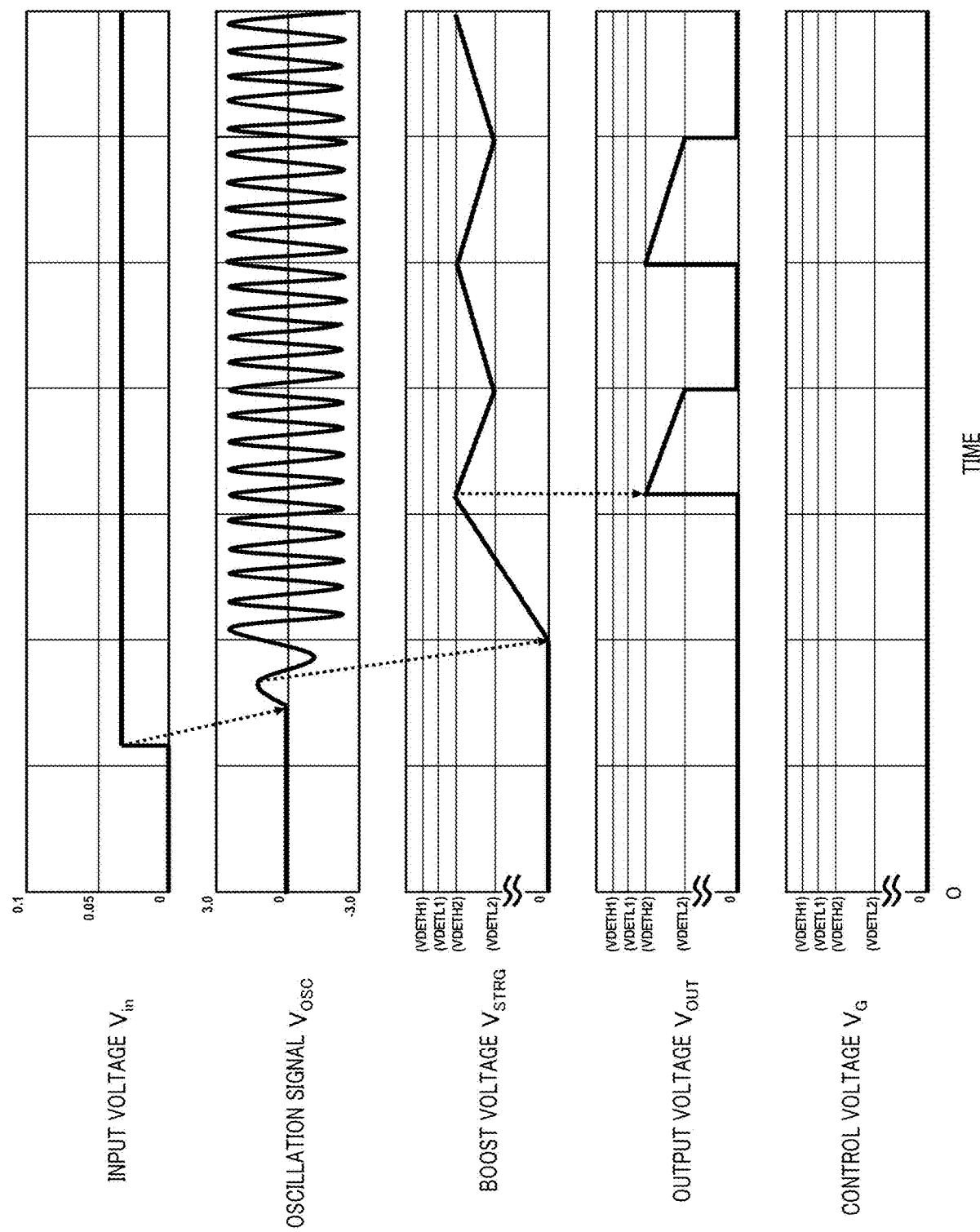
FIG. 3 shows a transition of a voltage at each location of the power supply device 10.

FIG. 3 shows a transition of a voltage at each location of the power supply device 10. In each graph, a vertical axis represents a voltage and a horizontal axis represents a passage of time. An input voltage $V_{in}$ is the input voltage which is input to the oscillator circuit 100, an oscillation signal $V_{OSC}$ is the oscillation signal which is output by the oscillator circuit 100, a boost voltage $V_{STRG}$ is the boost voltage which is boosted by the step-up circuit 130, an output voltage $V_{OUT}$ is the output voltage which is output from the output terminal OUT of the power supply device 10, and a control voltage $V_G$ is the control voltage which is input to the control terminal of the first switch 140. FIG. 3 shows the transition of the voltage when the relationship between the current $I_{STRG}$ output from step-up circuit 130, the current $I_{VDD1}$ consumed by the first hysteresis comparator 180, the current $I_{VDD2}$ consumed by the second hysteresis comparator 190, and the current $I_{OUT}$ our output from the output terminal OUT is $I_{STRG} < I_{OUT} + I_{VDD1} + I_{VDD2}$.

The oscillator circuit 100 generates and outputs the oscillation signal $V_{OSC}$ when the input voltage $V_{in}$ reaches a predetermined voltage. With an initial electric charge being zero, the step-up capacitor 132 of the step-up circuit 130 starts the boosting operation in response to the oscillation signal $V_{OSC}$, an electric charge is accumulated in the step-up capacitor 132, and the boost voltage $V_{STRG}$ rises. Then, the control unit 160 controls at least one of the first switch 140 and the second switch 150 according to the boost voltage $V_{STRG}$.

Similarly to the case of FIG. 2, the second switch 150 is controlled to be turned on and start the output of the output voltage $V_{OUT}$ in response to the second hysteresis comparator 190 detecting that the boost voltage $V_{STRG}$ is higher than or equal to the third threshold value (VDETH2). Subsequently, in a relationship of the above-described currents, a value of the boost voltage $V_{STRG}$ decreases. The second switch 150 is controlled to be turned off and stop the output of the output voltage $V_{OUT}$ in response to the second hysteresis comparator 190 detecting that the boost voltage $V_{STRG}$ is lower than or equal to the fourth threshold value (VDETL2). Specifically, the second comparator 192 of the second hysteresis comparator 190 compares the boost voltage $V_{STRG}$ with the fourth threshold value set by the second threshold value setting unit 194, and when the boost voltage $V_{STRG}$ is lower than or equal to the fourth threshold value, the second comparator 192 outputs a signal to the control terminal of the second switch 150 to turn off the second switch 150. Thereby, the connection between the step-up circuit 130 and the output terminal OUT is cut off, and on the other hand, the boosting operation of the step-up circuit 130 continues, and thus the boost voltage $V_{STRG}$ rises.

Subsequently, the second switch 150 is controlled to be turned on and resume the output of the output voltage $V_{OUT}$ in response to the second hysteresis comparator 190 detecting that the boost voltage $V_{STRG}$ is higher than or equal to the third threshold value (VDETH2). Under the electric current condition in FIG. 3, the off state of the first switch 140 is maintained. By such a control, the external system connected to the output terminal OUT of the power supply device 10 of the present embodiment can operate at the output voltage $V_{OUT}$ in a range of the fourth threshold value (VDETL2) or higher and the third threshold value (VDETH2) or lower.

The power supply device 10 of the present embodiment can control the output voltage $V_{OUT}$ without stopping the operations of the oscillator circuit 100 and the step-up circuit 130, and does not waste the power from the input source for energy harvesting. Further, when the first switch 140 is off, the boosting operation can be assisted by a parasitic diode between the drain and a bulk. Further, the first switch 140 is connected to the control terminal of the third switch 108 via the first capacitor 110, and thus without limiting a negative amplitude of the output oscillation signal and without interfering with the boosting operation, it is possible to stop the boosting operation and reduce the oscillation frequency when the overvoltage is detected.

Figure 4:
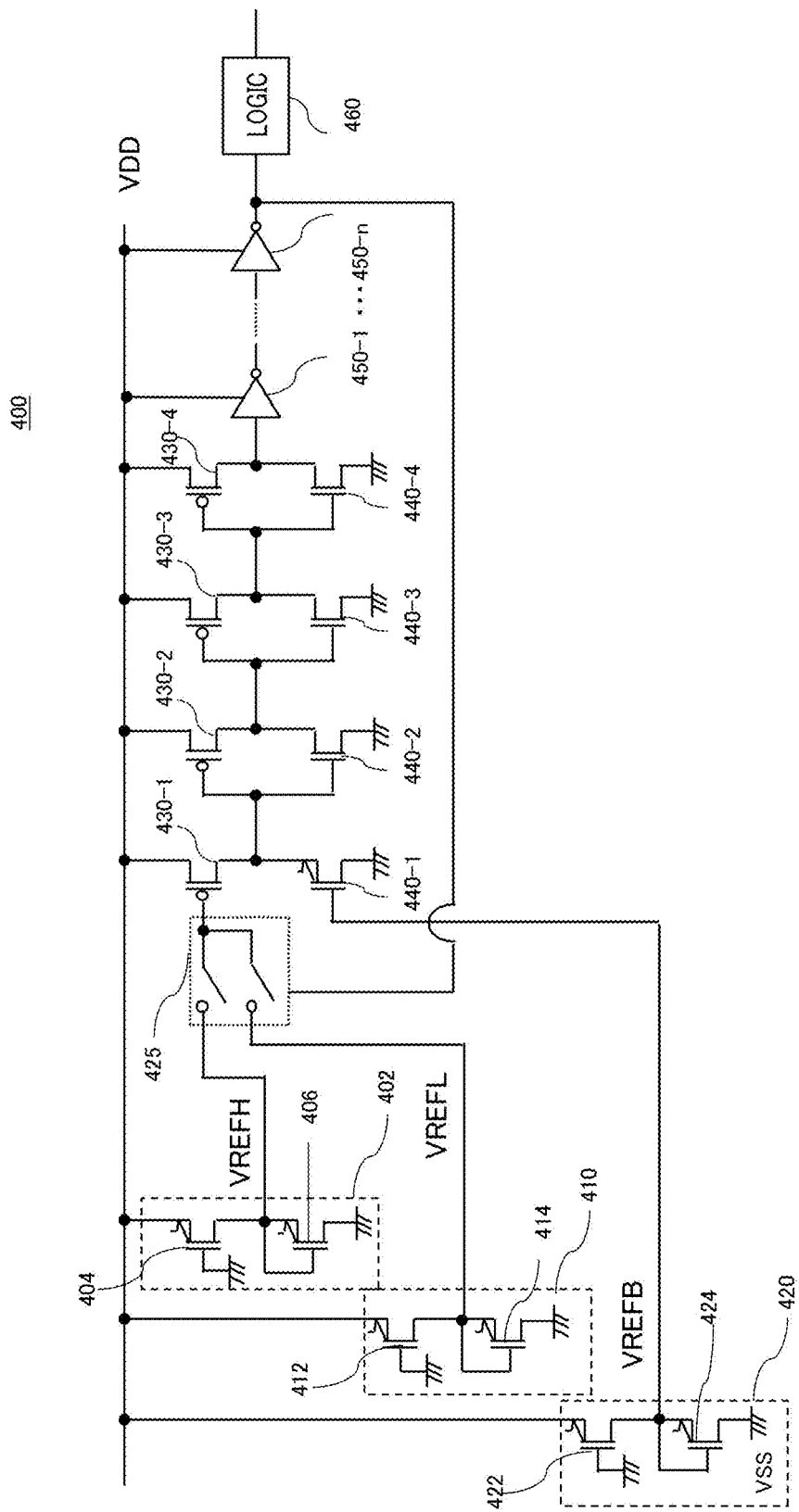
FIG. 4 shows a schematic diagram of a hysteresis comparator 400 of an example of the power supply device 10 of the present embodiment.

FIG. 4 shows a schematic diagram of a hysteresis comparator 400 of an example of the power supply device 10 of the present embodiment. The hysteresis comparator 400 shown in FIG. 4 may be an example of the first hysteresis comparator 180, and may also be an example of the second hysteresis comparator 190. A voltage VDD is, for example, a voltage due to the current $I_{VDD1}$ or $I_{VDD2}$ which is input from the step-up circuit 130 to the first hysteresis comparator 180 or the second hysteresis comparator 190 in FIG. 1.

The hysteresis comparator 400 has a first reference voltage circuit 402, a second reference voltage circuit 410, a third reference voltage circuit 420, a threshold value setting unit 425, a plurality of PMOS transistors 430, a plurality of NMOS transistors 440, and a plurality of inverters 450 and a logic 460.

The first reference voltage circuit 402 is connected to the threshold value setting unit 425 and outputs a first reference voltage VREFH. The first reference voltage circuit 402 has an NMOS transistor 404 of the depletion type and an NMOS transistor 406 of an enhancement type. The NMOS transistor 404 of the depletion type has a first end which is connected to the voltage VDD, a second end which is connected to the NMOS transistor 406 of the enhancement type, and a control terminal which is connected to the base voltage terminal. Herein, the gate terminal may be at the same potential as the source terminal. The NMOS transistor 406 of the enhancement type has a first end which is connected to the NMOS transistor 404 of the depletion type, a second end which is connected to the base voltage terminal VSS, and a control terminal which is connected to a node between the NMOS transistor 404 of the depletion type and the NMOS transistor 406 of the enhancement type, and the threshold value setting unit 425.

The second reference voltage circuit 410 outputs a second reference voltage VREFL. The second reference voltage circuit 410 may have an NMOS transistor 412 of the depletion type and an NMOS transistor 414 of the enhancement type, and have a configuration similar to that of the first reference voltage circuit 402.

The third reference voltage circuit 420 outputs a third reference voltage VREFB. The third reference voltage circuit 420 may have an NMOS transistor 422 of the depletion type and an NMOS transistor 424 of the enhancement type, and have a configuration similar to that of the first reference voltage circuit 402.

The threshold value setting unit 425 is an example of the first threshold value setting unit 184 or the second threshold value setting unit 194. The threshold value setting unit 425 may be a switch that outputs any one of the second reference voltage VREFL and the first reference voltage VREFH to a control terminal of a PMOS transistor 430-1 in response to the output of the hysteresis comparator 400.

In the hysteresis comparator 400, the PMOS transistors 430 and the NMOS transistors 440 that are connected in series between the voltage node $V_{STRG}$ and the base voltage terminal are formed in multiple stages. In a first stage, the control terminal of the PMOS transistor 430-1 is connected to an output of the threshold value setting unit 425, and a control terminal of the NMOS transistor 440-1 is connected to the third reference voltage circuit 420. In a second stage and subsequent stages, control terminals of the PMOS transistors 430 and the NMOS transistors 440 are connected to nodes between the PMOS transistors 430 and the NMOS transistors 440 in the previous stage.

The plurality of inverters are connected in series with each other, and an input of an inverter 450-1 in a first stage is connected to a node between a PMOS transistor 430-4 and an NMOS transistor 440-4 in the final stage. An output of the final inverter 450-$n$ is connected to the logic 460. The logic 460 outputs a signal indicating the comparison result between the threshold value and the boost voltage.

With such a configuration, the hysteresis comparator 400 can generate the threshold value (VDETH/L=VREFH/L+ (Vth of PMOS 430-1)) and execute the comparison.

Figure 5:
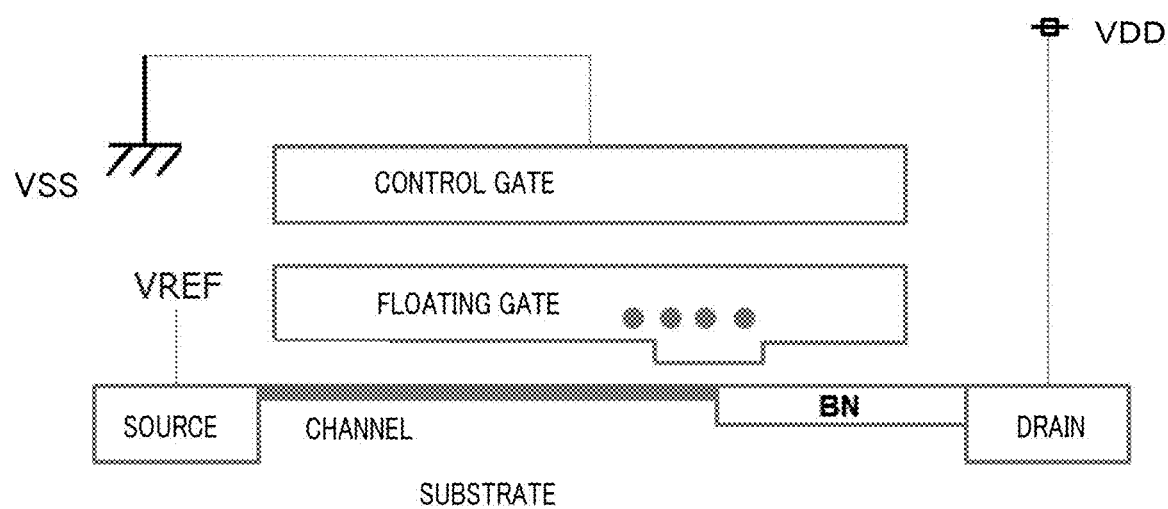
FIG. 5 shows a schematic diagram of an NMOS transistor of a depletion type.

FIG. 5 shows a schematic diagram of an NMOS transistor of a depletion type. The NMOS transistor of the depletion type in FIG. 5 may be used in at least one of the first reference voltage circuit 402, the second reference voltage circuit 410, and the third reference voltage circuit 420. The NMOS transistor of the depletion type has a floating gate and a control gate on a substrate on which the source, the drain, and a channel are formed. The drain is connected to the voltage VDD, the control gate is connected to the base voltage terminal VSS, and the source outputs the reference voltage VREF.

Figure 6:
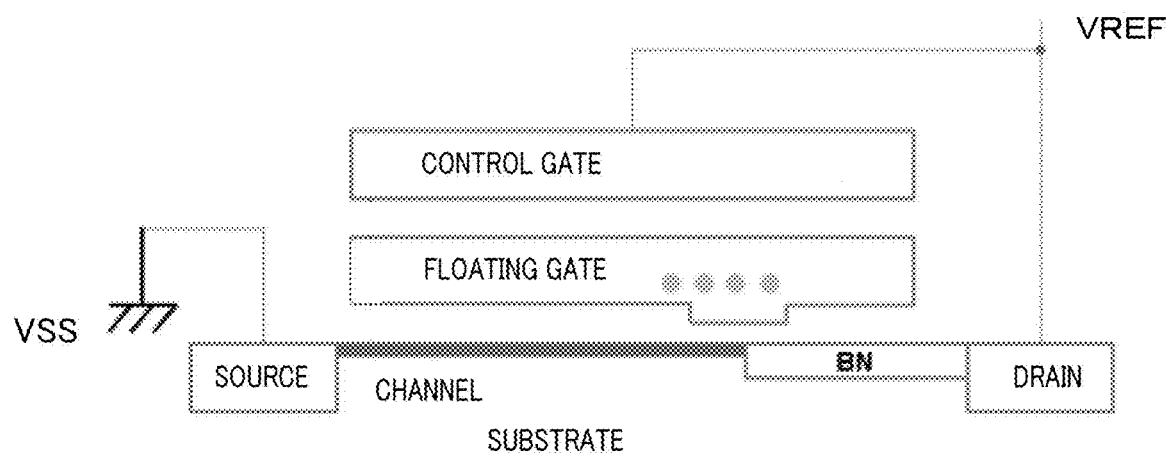
FIG. 6 shows a schematic diagram of an NMOS transistor of an enhancement type.

FIG. 6 shows a schematic diagram of an NMOS transistor of an enhancement type. The NMOS transistor of the enhancement type in FIG. 6 may be used in at least one of the first reference voltage circuit 402, the second reference voltage circuit 410, and the third reference voltage circuit 420. The NMOS transistor of the enhancement type has the floating gate and the control gate on the substrate on which the source, the drain, and the channel are formed. The source is connected to the base voltage terminal VSS, and the drain and the control gate outputs the reference voltage VREF.

The NMOS transistors in FIG. 5 and FIG. 6 can freely adjust the threshold value as seen from the control gate by causing the electric charge to flow in and out of the floating gate, and as a result, can freely adjust the stable reference voltage VREF. Thereby, it is not necessary to generate a voltage with a resistor tap or the like, and an area of the circuit can be reduced by reducing the number of parts. The threshold value of the hysteresis comparator 400 in the power supply device 10 can be freely determined.

Figure 7:
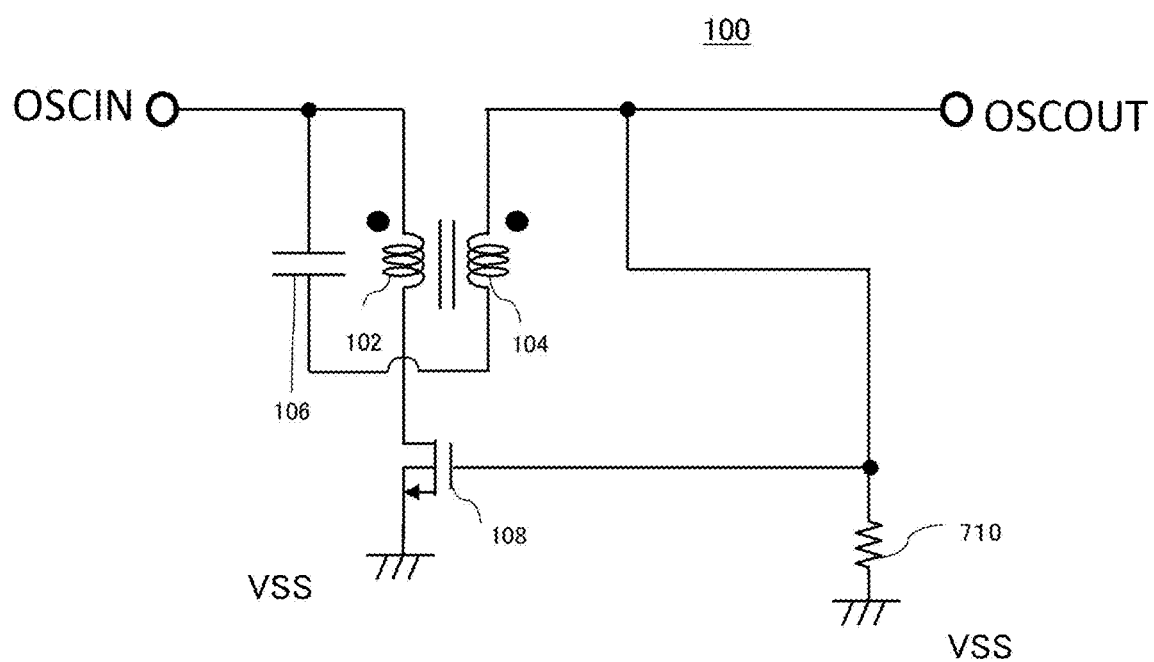
FIG. 7 shows a first modification example of an oscillator circuit 100 used in the power supply device 10 of the present embodiment.

FIG. 7 shows a first modification example of an oscillator circuit 100 used in the power supply device 10 of the present embodiment. The oscillator circuit 100 of the first modification example has a configuration and a function similar to those of the oscillator circuit 100 in FIG. 1; however, it should be noted that the oscillator circuit 100 of the first modification example further has a resistor 710. The resistor 710 has a first end which is connected to a node between the control terminal of the third switch 108 and the output terminal OSCOUT of the oscillator circuit 100, and a second end which is connected to the base voltage terminal VSS.

Figure 8:
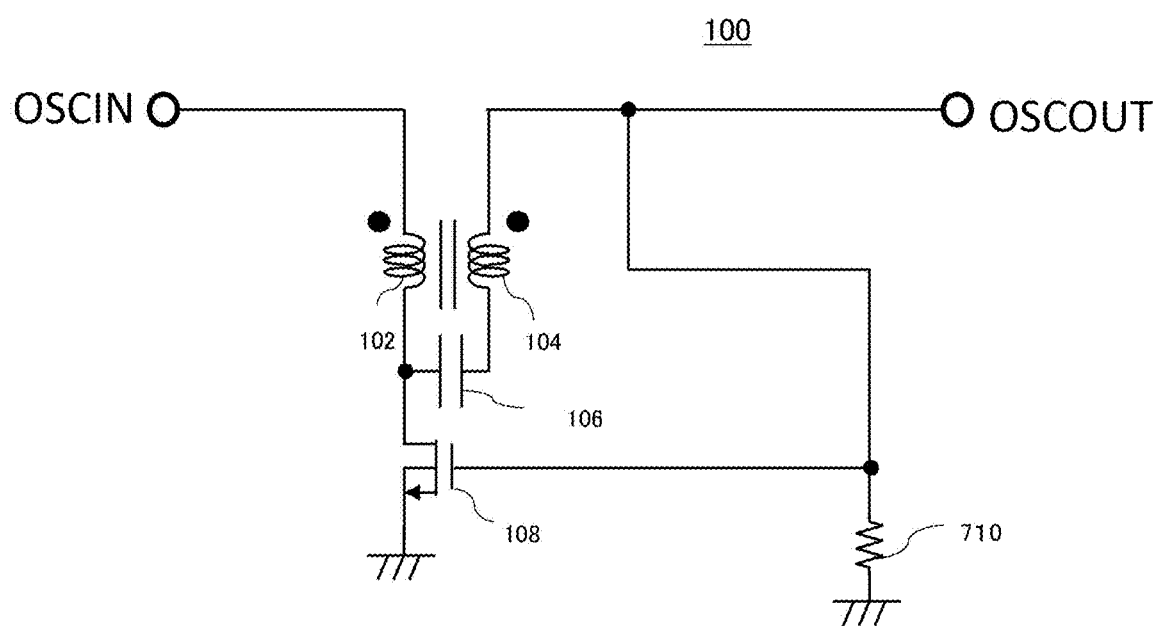
FIG. 8 shows a second modification example of the oscillator circuit 100 used in the power supply device 10 of the present embodiment.

FIG. 8 shows a second modification example of the oscillator circuit 100 used in the power supply device 10 of the present embodiment. The oscillator circuit 100 of the second modification example has a configuration and a function similar to those of the oscillator circuit 100 of the first modification example in FIG. 7; however, it should be noted that the first oscillator capacitor 106 has a first end which is connected a second end of the first coil 102, and a second end which is connected to a second end of the second coil 104.

Figure 9:
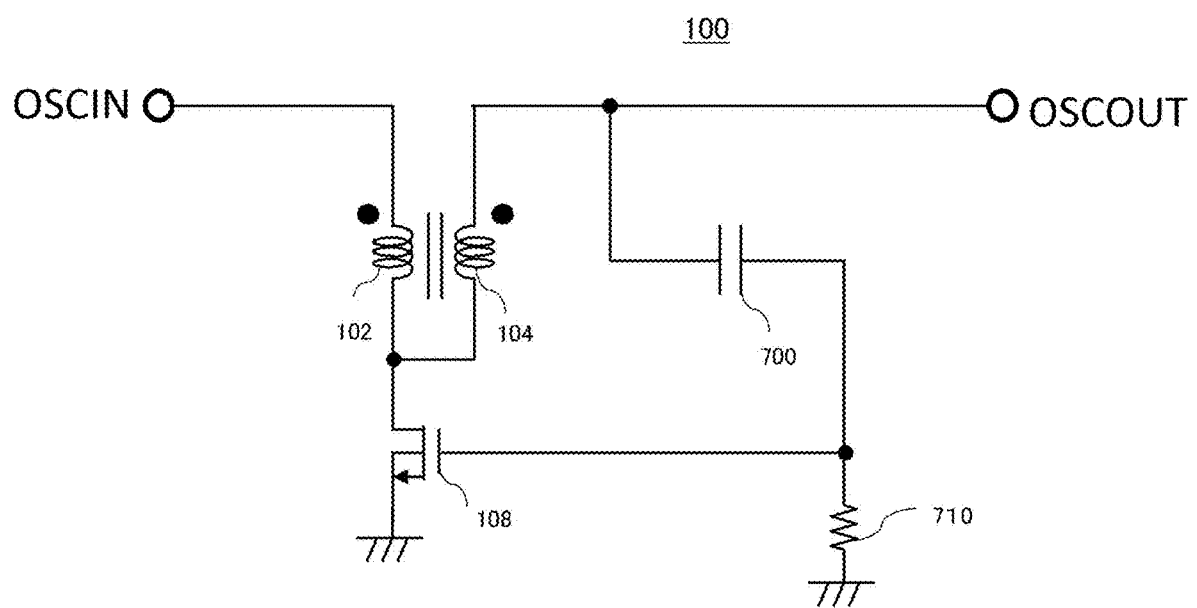
FIG. 9 shows a third modification example of the oscillator circuit 100 used in the power supply device 10 of the present embodiment.

FIG. 9 shows a third modification example of the oscillator circuit 100 used in the power supply device 10 of the present embodiment. The oscillator circuit 100 of the third modification example has a configuration and a function similar to those of the oscillator circuit 100 of the first modification example in FIG. 7; however, it should be noted that the oscillator circuit 100 of the third modification example does not have the first oscillator capacitor 106, and has a second oscillator capacitor 700. The second oscillator capacitor 700 has a first end which is connected to the output terminal OSCOUT of the oscillator circuit 100, and a second end which is connected to the control terminal of the third switch 108. The resistor 710 has a first end which is connected to a node between the control terminal of the third switch 108 and the second end of the second oscillator capacitor 700, and a second end which is connected to the base voltage terminal VSS. A second end of the second coil 104 is connected to a node between the first coil 102 and the third switch 108.

Figure 10:
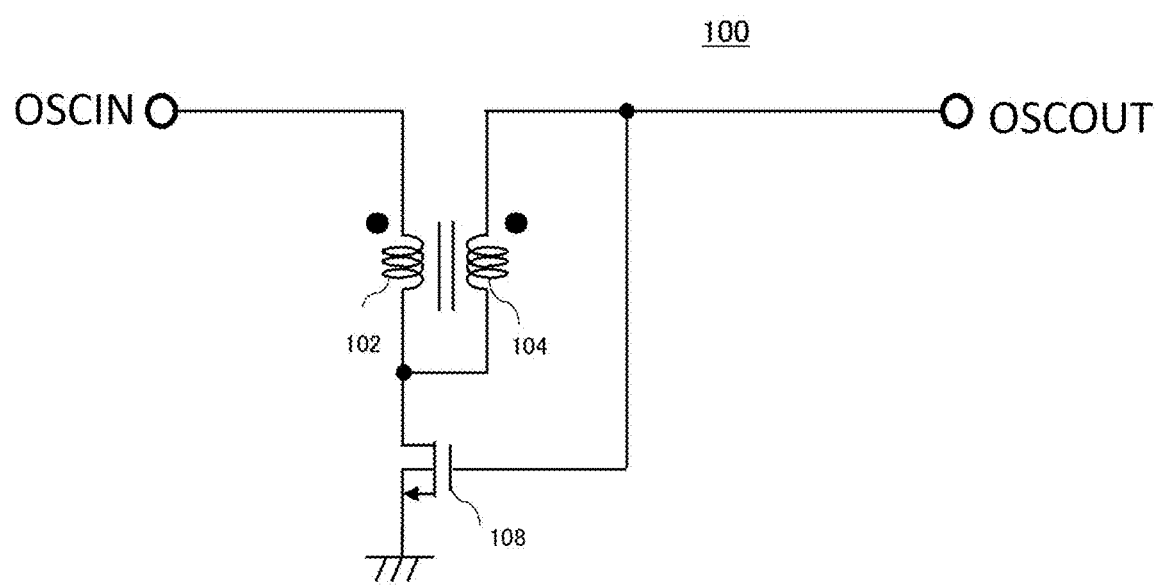
FIG. 10 shows a fourth modification example of the oscillator circuit 100 used in the power supply device 10 of the present embodiment.

FIG. 10 shows a fourth modification example of the oscillator circuit 100 used in the power supply device 10 of the present embodiment. The oscillator circuit 100 of the fourth modification example has a configuration and a function similar to those of the oscillator circuit 100 in FIG. 1; however, it should be noted that the oscillator circuit 100 of the fourth modification example does not have the first oscillator capacitor 106, and the second coil 104 has a first end which is connected to the output terminal OSCOUT of the oscillator circuit 100, and a second end which is connected to a second end of the first coil 102.

Figure 11:
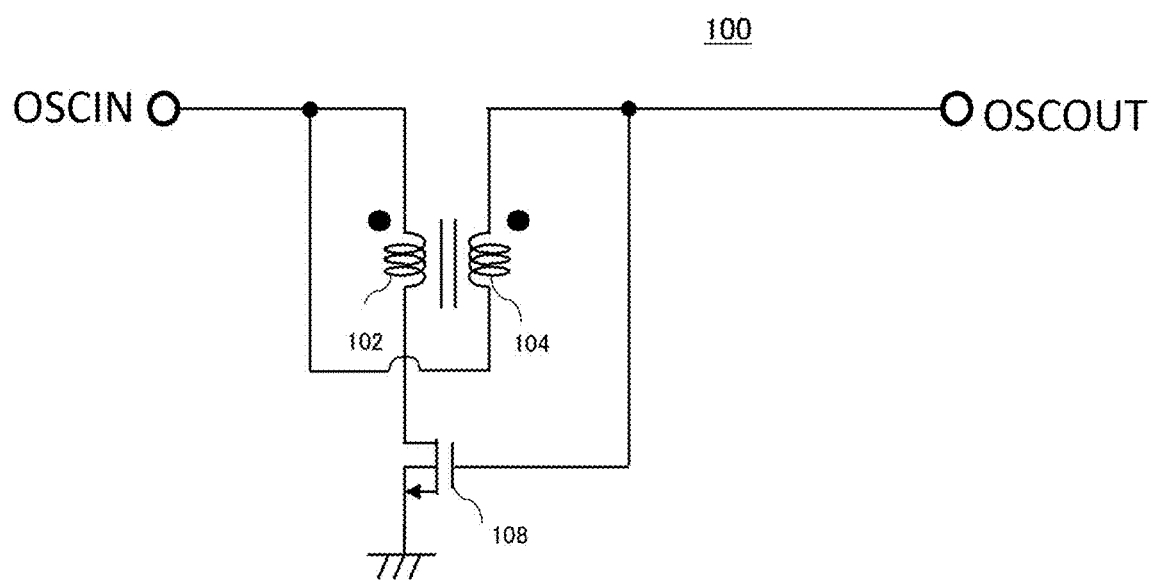
FIG. 11 shows a fifth modification example of the oscillator circuit 100 used in the power supply device 10 of the present embodiment.

FIG. 11 shows a fifth modification example of the oscillator circuit 100 used in the power supply device 10 of the present embodiment. The oscillator circuit 100 of the fifth modification example has a configuration and a function similar to those of the oscillator circuit 100 in FIG. 1; however, it should be noted that the oscillator circuit 100 of the fifth modification example does not have the first oscillator capacitor 106, and the second coil 104 has a first end which is connected to the output terminal OSCOUT of the oscillator circuit 100, and a second end which is connected to the input terminal OSCIN of the oscillator circuit 100.

The oscillator circuit 100 in any modification example described above can facilitate the oscillation in a positive feedback loop to output the oscillation signal $V_{OSC}$ in accordance with the input voltage $V_{in}$.

Figure 12:
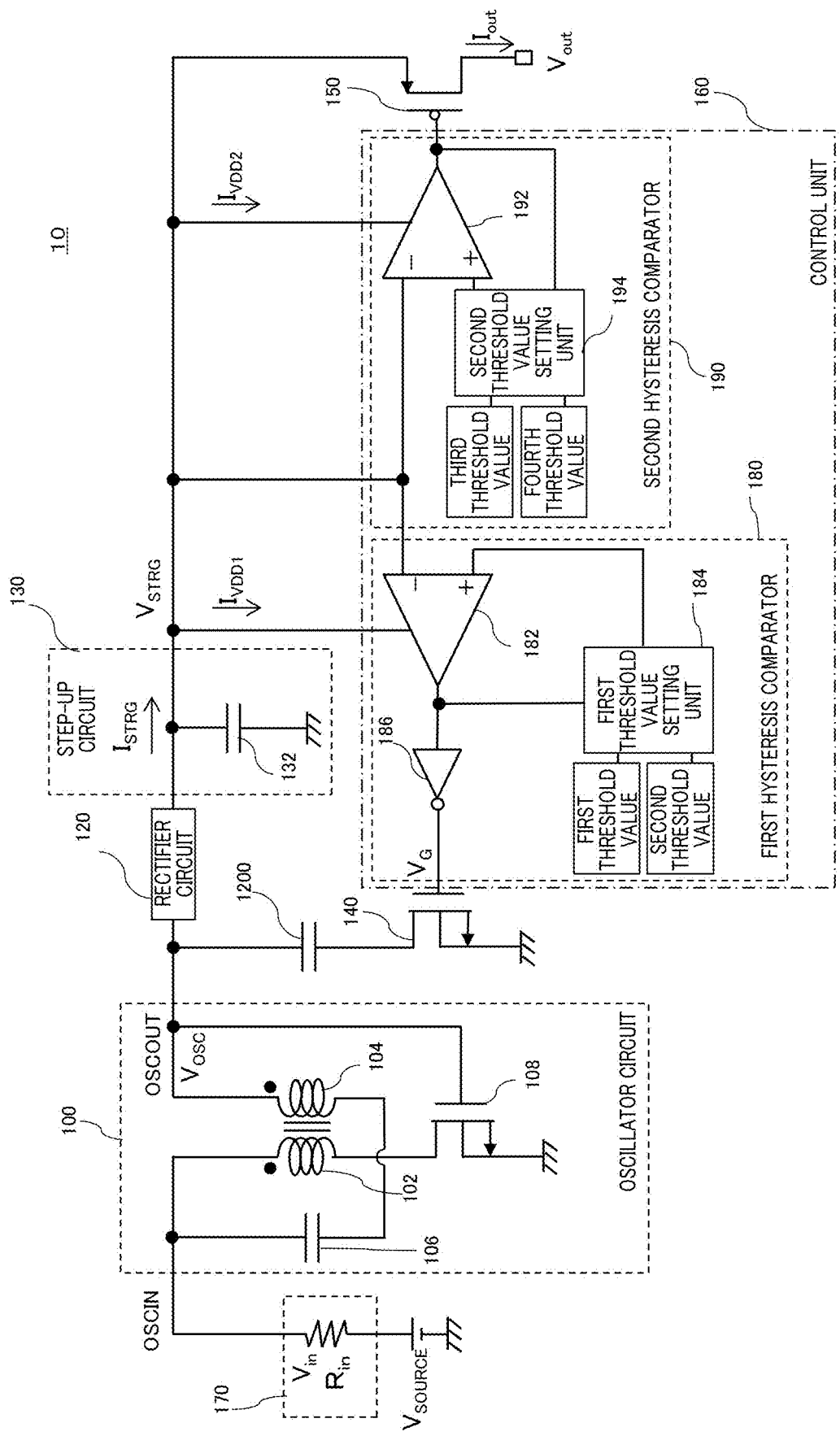
FIG. 12 shows a first modification example of the power supply device 10 of the present embodiment.

FIG. 12 shows a first modification example of the power supply device 10 of the present embodiment. The power supply device 10 of the first modification example has a configuration and a function similar to those of the power supply device 10 in FIG. 1; however, it should be noted that the power supply device 10 of the first modification example does not have the first capacitor 110, and has a second capacitor 1200.

The second capacitor 1200 has a first end which is connected to the node between the oscillator circuit 100 and the step-up circuit 130, and a second end which is connected to the first switch 140. In FIG. 12, the second capacitor 1200 has the first end which is connected to a node between the oscillator circuit 100 and the rectifier circuit 120.

The power supply device 10 of the first modification example can perform a voltage control similar to that of the power supply device 10 of FIG. 1 to supply the power. The power supply device 10 of the first modification example can suppress current consumption necessary for boosting by off capacitance of the second capacitor 1200 and the first switch 140, and can adjust current consumption and an oscillation speed without changing the oscillation frequency.

Figure 13:
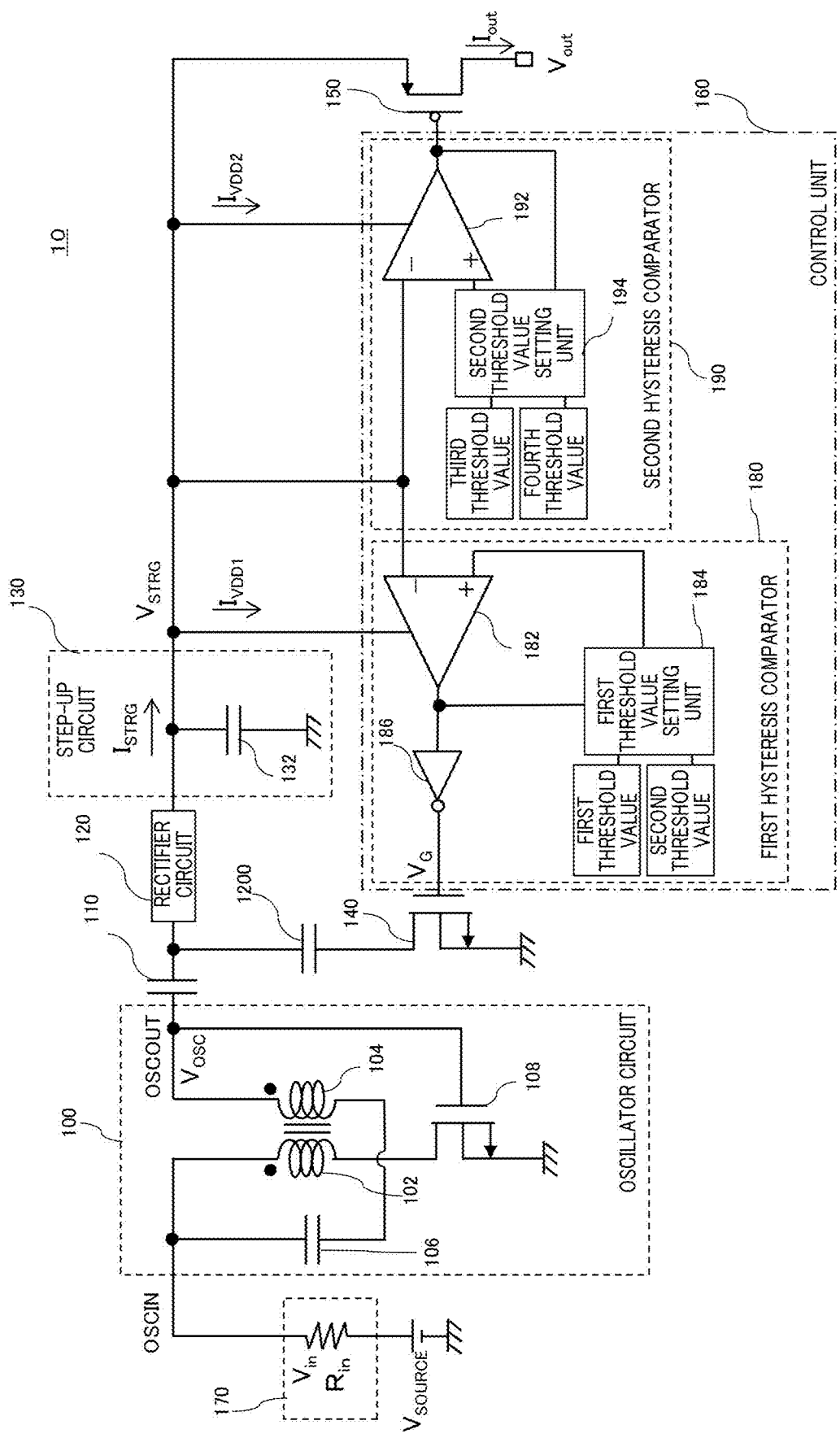
FIG. 13 shows a second modification example of the power supply device 10 of the present embodiment.

FIG. 13 shows a second modification example of the power supply device 10 of the present embodiment. The power supply device 10 of the second modification example has a configuration and a function similar to those of the power supply device 10 in FIG. 1; however, it should be noted that the power supply device 10 of the second modification example further has the second capacitor 1200. The second capacitor 1200 has a first end which is connected to the node between the oscillator circuit 100 and the step-up circuit 130, and a second end which is connected to the first switch 140. In FIG. 12, the second capacitor 1200 has the first end which is connected to the node between the first capacitor 110 and the rectifier circuit 120.

The power supply device 10 of the second modification example can perform a voltage control similar to that of the power supply device 10 of FIG. 1 to supply the power. The power supply device 10 of the second modification example can suppress current consumption necessary for boosting by off capacitance of the first capacitor 110, the second capacitor 1200, and the first switch 140, and can adjust current consumption and an oscillation speed without changing the oscillation frequency.

Figure 14:
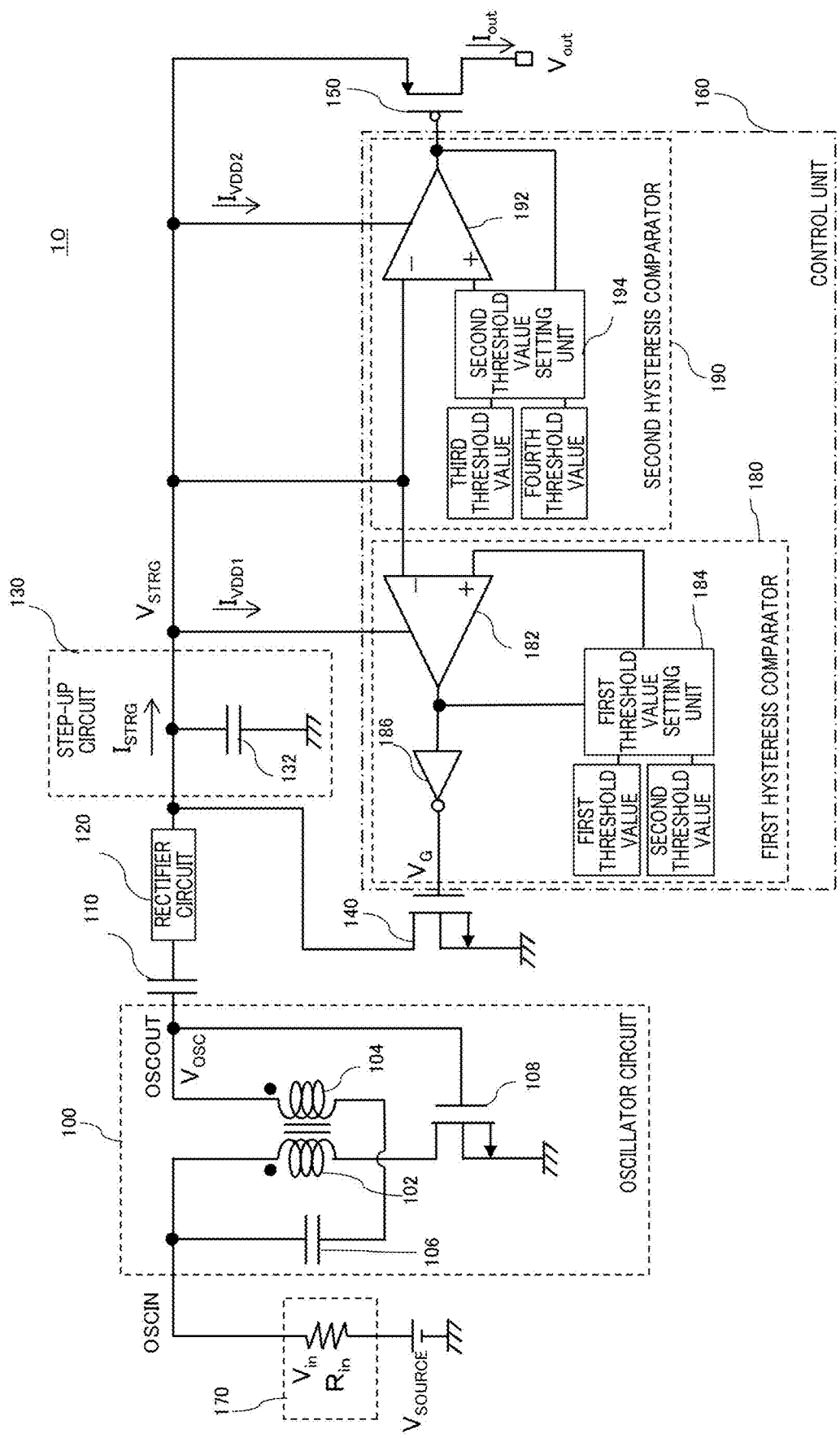
FIG. 14 shows a third modification example of the power supply device 10 of the present embodiment.

FIG. 14 shows a third modification example of the power supply device 10 of the present embodiment. The power supply device 10 of the third modification example has a configuration and a function similar to those of the power supply device 10 of FIG. 1; however, it should be noted that the first switch 140 has a first end which is connected between the rectifier circuit 120 and the step-up circuit 130, and a second end which is connected to the base voltage terminal VSS.

The power supply device 10 of the third modification example can perform a voltage control similar to that of the power supply device 10 of FIG. 1 to supply the power. In the power supply device 10 of the third modification example, when the first switch 140 is turned on, the electric charge is extracted from the step-up capacitor 132, which makes it possible to lower the boost voltage. Thereby, even in a state in which the external system connected to the output terminal OUT does not draw the current in an idle state, the $V_{STRG}$ or the $V_{OUT}$ can instantly get out of a state of VDETH1 immediately before the overvoltage.

Note that the first capacitor 110, the second capacitor 1200, the step-up capacitor 132, the first oscillator capacitor 106, and the second oscillator capacitor 700 may be different from each other or similar to each other, and further, the first switch 140, the second switch 150, and the third switch 108 may be different from each other or similar to each other.

Further, the base voltage terminals VSS in the plurality of configurations of the power supply device 10 may be terminals with the same voltage (for example, the ground terminal), or terminals with different voltages from each other.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A power supply device configured to boost an input voltage to output an output voltage, wherein the power supply device comprising:
   an oscillator circuit configured to receive the input voltage and to output an oscillation signal;
   a step-up circuit configured to output a boost voltage based on the oscillation signal;
   a first hysteresis comparator configured to compare the boost voltage with a threshold value, and to output a comparison result;
   a rectifier circuit coupled between the oscillator circuit and the step-up circuit, and configured to cause a current from the oscillator circuit to flow to the step-up circuit; and
   a first switch that has a first end which is coupled to a base voltage terminal, a second end which is coupled to a node between the oscillator circuit and the rectifier circuit, and a control terminal to which the comparison result is input, wherein
   the first hysteresis comparator is configured to control the first switch to be turned on in response to a detection that the boost voltage is higher than or equal to a first threshold value, and to control the first switch to be turned off in response to a detection that the boost voltage is lower than or equal to a second threshold value.

2. The power supply device according to claim 1, comprising:
   a first capacitor that has a first end which is coupled to the oscillator circuit, and a second end which is coupled to a node between the oscillator circuit and the step-up circuit.

3. The power supply device according to claim 2, wherein the first switch is coupled between the step-up circuit and the first capacitor.

4. The power supply device according to claim 1, comprising:
   a second capacitor that has a first end which is coupled to a node between the oscillator circuit and the step-up circuit, and a second end which is coupled to the first switch.

5. The power supply device according to claim 1, further comprising:
   a second hysteresis comparator configured to compare the boost voltage with a threshold value; and
   a second switch that is connected to an output terminal configured to output the output voltage and that is controlled based on a comparison result of the second hysteresis comparator.

6. A power supply device configured to boost an input voltage to output an output voltage, wherein the power supply device comprising:
   an oscillator circuit configured to receive the input voltage and to output an oscillation signal;
   a step-up circuit configured to output a boost voltage based on the oscillation signal;
   a first hysteresis comparator configured to compare the boost voltage with a threshold value, and to output a comparison result;
   a rectifier circuit coupled between the oscillator circuit and the step-up circuit, and configured to cause a current from the oscillator circuit to flow to the step-up circuit;
   a first switch that has a first end which is coupled to a base voltage terminal, a second end which is coupled to a node between the oscillator circuit and the rectifier circuit, and a control terminal to which the comparison result is input;
   a second hysteresis comparator configured to compare the boost voltage with a threshold value; and
   a second switch that is connected to an output terminal configured to output the output voltage and that is controlled based on a comparison result of the second hysteresis comparator.

7. The power supply device according to claim 1, wherein the oscillator circuit includes:
   a first coil that has a first end which is coupled to an input terminal of the oscillator circuit;
   a second coil that has a first end which is coupled to an output terminal of the oscillator circuit;
   a third switch that is coupled between a second end of the first coil and the base voltage terminal and that has a control terminal which is coupled to the output terminal of the oscillator circuit; and
   a first oscillator capacitor that has a first end which is coupled to the first end of the first coil, and a second end which is coupled to a second end of the second coil.

8. The power supply device according to claim 7, wherein the oscillator circuit further includes a resistor that has a first end which is coupled to a node between the control terminal of the third switch and the output terminal of the oscillator circuit, and a second end which is coupled to a base voltage terminal.

9. The power supply device according to claim 1, wherein the oscillator circuit includes:
   a first coil that has a first end which is coupled to an input terminal of a oscillator circuit;
   a second coil that has a first end which is coupled to an output terminal of the oscillator circuit;
   a third switch that is coupled between a second end of the first coil and a base voltage terminal and that has a control terminal which is coupled to the output terminal of the oscillator circuit;
   a resistor that has a first end which is coupled to a node between the control terminal of the third switch and the output terminal of the oscillator circuit, and a second end which is coupled to the base voltage terminal; and a first oscillator capacitor that has a first end which is coupled to a second end of the first coil, and a second end which is coupled to a second end of the second coil.

10. The power supply device according to claim 1, wherein
the oscillator circuit includes:
a first coil that has a first end which is coupled to an input terminal of the oscillator circuit;
a second coil that has a first end which is coupled to an output terminal of the oscillator circuit, and a second end which is coupled to a second end of the first coil;
a third switch that is coupled between the second end of the first coil and a base voltage terminal;
a second oscillator capacitor that has a first end which is coupled to the output terminal of the oscillator circuit, and a second end which is coupled to a control terminal of the third switch; and
a resistor that has a first end which is coupled to a node between the control terminal of the third switch and the second end of the second oscillator capacitor, and a second end which is coupled to a base voltage terminal.

11. The power supply device according to claim 1, wherein
the oscillator circuit includes:
a first coil that has a first end which is coupled to an input terminal of the oscillator circuit;
a second coil that has a first end which is coupled to an output terminal of the oscillator circuit, and a second end which is coupled to a second end of the first coil; and
a third switch that is coupled between the second end of the first coil and the base voltage terminal and that has a control terminal which is coupled to the output terminal of the oscillator circuit.

12. The power supply device according to claim 1, wherein
the oscillator circuit includes:
a first coil that has a first end which is coupled to an input terminal of the oscillator circuit;
a second coil that has a first end which is coupled to an output terminal of the oscillator circuit, and a second end which is coupled to the input terminal of the oscillator circuit; and
a third switch that is coupled between a second end of the first coil and a base voltage terminal and that has a control terminal which is coupled to the output terminal of the oscillator circuit.

13. The power supply device according to claim 7, wherein
the third switch is an NMOS transistor of a depletion type, or a Native NMOS transistor.

14. The power supply device according to claim 8, wherein
the third switch is an NMOS transistor of a depletion type, or a Native NMOS transistor.

15. The power supply device according to claim 9, wherein
the third switch is an NMOS transistor of a depletion type, or a Native NMOS transistor.

16. The power supply device according to claim 10, wherein
the third switch is an NMOS transistor of a depletion type, or a Native NMOS transistor.

17. The power supply device according to claim 11, wherein
the third switch is an NMOS transistor of a depletion type, or a Native NMOS transistor.

18. The power supply device according to claim 12, wherein
the third switch is an NMOS transistor of a depletion type, or a Native NMOS transistor.

19. The power supply device according to claim 1, wherein
the input voltage is a voltage generated by energy harvesting.

20. A power supply device configured to boost an input voltage to output an output voltage, wherein the power supply device comprising:
an oscillator circuit configured to receive the input voltage and to output an oscillation signal;
a step-up circuit configured to output a boost voltage based on the oscillation signal;
a first hysteresis comparator configured to compare the boost voltage with a threshold value, and to output a comparison result;
a rectifier circuit coupled between the oscillator circuit and the step-up circuit, and configured to cause a current from the oscillator circuit to flow to the step-up circuit;
a first switch that has a first end which is coupled to a base voltage terminal, a second end which is coupled to a node between the oscillator circuit and the rectifier circuit, and a control terminal to which the comparison result is input; and
a second capacitor that has a first end which is coupled to a node between the oscillator circuit and the step-up circuit, and a second end which is coupled to the first switch.

21. The power supply device according to claim 6, wherein
the second hysteresis comparator is configured to control the second switch to be turned on and start the output of the output voltage in response to a detection that the boost voltage is higher than or equal to a third threshold value, and to control the second switch to be turned off and stop the output of the output voltage in response to a detection that the boost voltage is lower than or equal to a fourth threshold value.

* * * * *